US011404916B2

(12) United States Patent
Yoshida et al.

(10) Patent No.: US 11,404,916 B2
(45) Date of Patent: Aug. 2, 2022

(54) ELECTRONIC CIRCUIT, MODULE, AND SYSTEM

(71) Applicant: Seiko Holdings Kabushiki Kaisha, Tokyo (JP)

(72) Inventors: Yoshifumi Yoshida, Chiba (JP); Noboru Kawai, Chiba (JP)

(73) Assignee: SEIKO HOLDINGS KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/186,794

(22) Filed: Feb. 26, 2021

(65) Prior Publication Data
US 2021/0281114 A1 Sep. 9, 2021

(30) Foreign Application Priority Data

Mar. 3, 2020 (JP) .............................. JP2020-036241

(51) Int. Cl.
*H02J 7/02* (2016.01)
*H02J 50/20* (2016.01)
(Continued)

(52) U.S. Cl.
CPC ............. *H02J 50/20* (2016.02); *B60R 25/24* (2013.01); *H02J 50/402* (2020.01); *H02M 3/02* (2013.01); *H05K 5/0217* (2013.01)

(58) Field of Classification Search
CPC ...... H05K 5/0217; H02J 50/20; H02J 50/402; B60R 25/24; H02M 3/02
See application file for complete search history.

(56) References Cited

U.S. PATENT DOCUMENTS 8,461,817 B2 * 6/2013 Martin .................... H02J 50/20
323/282
2003/0231566 A1 * 12/2003 Smith ..................... G11C 5/142
369/47.25
(Continued)

FOREIGN PATENT DOCUMENTS

JP 2011-024332 A 2/2011

*Primary Examiner* — Jared Fureman
*Assistant Examiner* — Esayas G Yeshaw
(74) *Attorney, Agent, or Firm* — Crowell & Moring LLP

(57) ABSTRACT

A convenient electronic circuit in which a switch can be switched through electric power obtained using weak radio waves is provided. An electronic circuit includes: a power supply configured to output direct current (DC) electric power; a switch which switches a connection state between the power supply and a load; a first power conversion circuit which converts electric power obtained using first radio waves received by a first antenna capable of receiving the first radio waves in a first direction into DC electric power and which outputs the converted DC electric power from a first DC power output terminal; a second power conversion circuit which converts electric power obtained using second radio waves received by a second antenna capable of receiving the second radio waves in a second direction different from the first direction into DC electric power and outputs the converted DC electric power from a second DC power output terminal; and a control circuit which controls a connection state of the switch such that it is in a conduction state when the first power conversion circuit outputs DC electric power due to the reception of the first radio waves by the first antenna and controls the connection state of the switch such that it is in a non-conduction state when the second power conversion circuit outputs DC electric power due to the reception of the second radio waves by the second antenna.

20 Claims, 11 Drawing Sheets

(51) Int. Cl.
  *H02J 50/40*    (2016.01)
  *B60R 25/24*    (2013.01)
  *H05K 5/02*     (2006.01)
  *H02M 3/02*     (2006.01)

(56) References Cited

U.S. PATENT DOCUMENTS

| | | | |
|---|---|---|---|
| 2015/0236518 A1* | 8/2015 | Matsumoto | H02J 50/80 |
| | | | 307/104 |
| 2016/0241300 A1* | 8/2016 | Penticoff | H03F 3/245 |
| 2018/0206097 A1* | 7/2018 | Michaud | H04W 16/26 |
| 2018/0331581 A1* | 11/2018 | Hosseini | H02J 50/40 |
| 2020/0094700 A1* | 3/2020 | Hui | B60L 53/60 |

* cited by examiner

ELECTRONIC CIRCUIT, MODULE, AND SYSTEM

RELATED APPLICATIONS

This application claims priority to Japanese Patent Application No. 2020-036241, filed on Mar. 3, 2020, the entire content of which is incorporated herein by reference.

BACKGROUND OF THE INVENTION

1. Field of the Invention

The present invention relates to an electronic circuit, a module, and a system.

2. Description of the Related Art

In the related art, in electronic keys used for key systems for vehicles, electronic keys communicate with the vehicles when batteries built into the electronic keys are connected to control circuits using the electric power obtained by the radio waves from the vehicles. Techniques for minimizing the consumption of batteries in a standby state by cutting off the connection between batteries and circuits again if electronic keys are distant from vehicles (that is, during standby) are known (for example, refer to Patent Document 1)

PATENT DOCUMENTS

[Patent Document 1] Japanese Unexamined Patent Application, First Publication No. 2011-24332

SUMMARY OF THE INVENTION

In the related art as described above, an analog front-end circuit (AFE) inside an electronic key is started up using electric power obtained by radio waves from a vehicle. At this time, the AFE is started up using electric power obtained by radio waves from a specific apparatus provided in the vehicle or the like.

However, when it is attempted to start up the AFE using radio waves from the vehicle, the electronic key has a problem in that it takes time to store electric power required for starting up the AFE. That is to say, it is inconvenient to have to keep the electronic key close to a position in which the electronic key can receive radio waves from the vehicle until the electronic key is started up.

The present invention was made in view of such circumstances, and an object of the present invention is to provide a convenient electronic circuit in which a switch can be switched using electric power obtained by weak radio waves.

An electronic circuit according to an aspect of the present invention includes a switch which is connected between a power supply configured to output direct current (DC) electric power and a load driven by DC electric power supplied from the power supply and which switches a connection state between the power supply and the load to either a conduction state in which electric power is supplied from the power supply to the load or a non-conduction state in which the supply of electric power from the power supply to the load is cut off; a first power conversion circuit which includes a first power input terminal to which electric power obtained by first radio waves received by a first antenna capable of receiving the first radio waves in a first direction is input and a first DC power output terminal configured to output DC electric power and which converts electric power input to the first power input terminal into DC electric power and outputs the converted DC electric power from first DC power output terminal; a second power conversion circuit which includes a second power input terminal to which electric power obtained by second radio waves received by a second antenna capable of receiving the second radio waves in a second direction different from the first direction is input and a second DC power output terminal configured to output DC electric power and which converts electric power input to the second power input terminal into DC electric power and outputs the converted DC electric power from the second DC power output terminal; and a control circuit which includes a first input terminal connected to the first DC power output terminal of the first power conversion circuit, a second input terminal connected to the second DC power output terminal of the second power conversion circuit, and an output terminal connected to the switch and configured to control a connection state of the switch and which controls a connection state of the switch such that it is in a conduction state when the first power conversion circuit outputs DC electric power due to the reception of the first radio waves by the first antenna and controls the connection state of the switch such that it is in a non-conduction state when the second power conversion circuit outputs DC electric power due to the reception of the second radio waves by the second antenna.

Also, in an electronic circuit according to an aspect of the present invention, the first antenna and the second antenna may be provided at different positions from each other.

In an electronic circuit according to an aspect of the present invention, the first antenna and the second antenna may be provided at different angles from each other.

In an electronic circuit according to an aspect of the present invention, the first antenna and the second antenna may be provided perpendicular to each other.

In an electronic circuit according to an aspect of the present invention, the first antenna may be an electric field antenna, and the second antenna may be a magnetic field antenna.

In an electronic circuit according to an aspect of the present invention, the first antenna and the second antenna may be antennas having different lengths from each other.

A module according to an aspect of the present invention includes: the above-described electronic circuit; a power supply configured to output DC electric power; and a load driven by DC electric power supplied from the power supply.

A module according to an aspect of the present invention is accommodated in a housing with waterproofness.

A system according to an aspect of the present invention includes the above-described module; and a transmitter configured to transmit prescribed radio waves to the module.

According to the present invention, it is possible to provide a convenient electronic circuit which can be switched using electric power obtained by weak radio waves.

DETAILED DESCRIPTION OF THE PREFERRED EMBODIMENTS

[Constitution of Latch System 100]

A constitution of a latch system 100 will be described below with reference to the drawings.

Figure 1:
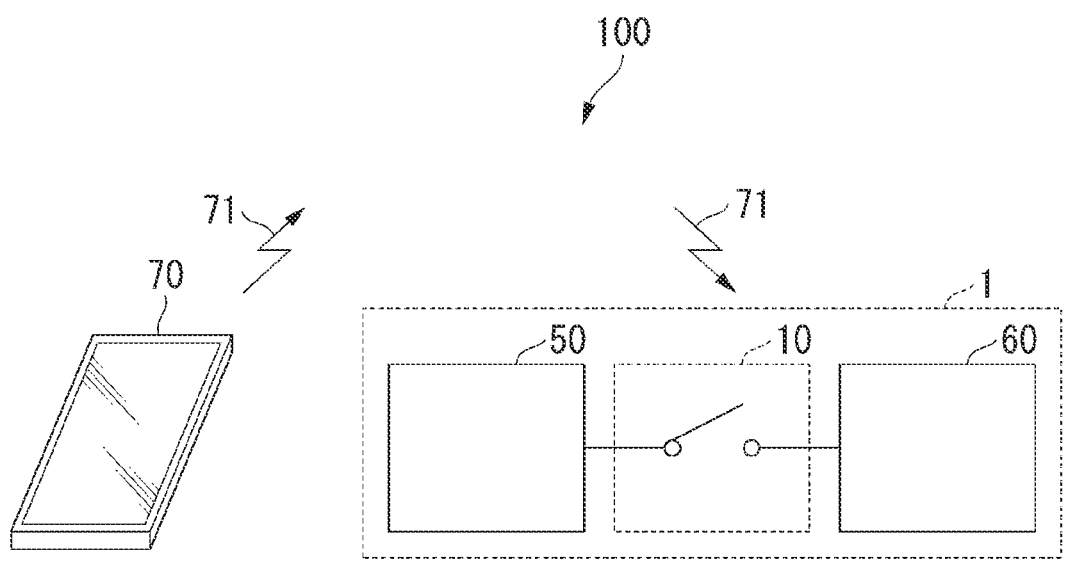
FIG. 1 is a diagram illustrating an example of a constitution of a latch system in an embodiment.

FIG. 1 is a diagram illustrating an example of the constitution of the latch system 100 in an embodiment. As illustrated in FIG. 1, the latch system 100 includes a transmitter 70 and a latch module 1.

The transmitter 70 is a terminal in which radio waves can be transmitted. Here, for example, the radio waves are radio waves transmitted by a transmission-side device during wireless communication performed in accordance with a communication standard such as Bluetooth (registered trademark) or Wi-Fi (registered trademark). The radio waves are not limited to a communication standard such as Bluetooth (registered trademark) or Wi-Fi (registered trademark), various communication methods can be adopted for the radio waves, and the radio waves may be transmitted through communication according to a unique standard in which the default communication standard is not satisfied.

For example, the transmitter 70 is a mobile information processing terminal in which wireless communication is possible such as multifunctional mobile phone terminals (smartphones), mobile phone terminals, personal digital assistants (PDAs), notebook PCs, and tablet PCs. The transmitter 70 is not limited to a mobile information processing terminal and may be another information processing terminal.

In this example, the transmitter 70 transmits radio waves 71.

The latch module 1 includes a power supply 50, a load 60, and a latch circuit 10. The latch module 1 receives the radio waves 71 transmitted from the transmitter 70.

The power supply 50 is a power supply configured to output direct current (DC) electric power. For example, the power supply 50 is a battery such as a lithium battery. When the latch module 1 is a small-sized device, the power supply 50 may be a battery as installed in a board. The power supply 50 supplies electric power to the load 60.

The load 60 has functions such as communication functions. For example, the load 60 may include a read only memory (ROM) (not shown), a random access memory (RAM) (not shown), and a central processing unit (CPU) (not shown).

The latch circuit 10 is connected between the power supply 50 and the load 60. The power supply 50 supplies electric power to the load 60 via the latch circuit 10.

The latch circuit 10 receives the radio waves 71 transmitted from the transmitter 70. The latch circuit 10 receives the radio waves 71 transmitted from the transmitter 70 to control a conduction state between the power supply 50 and the load 60. Hereinafter, the latch circuit 10 is also referred to as an "electronic circuit."

First Embodiment

A first embodiment of the present invention will be described below with reference to the drawings.

Figure 2:
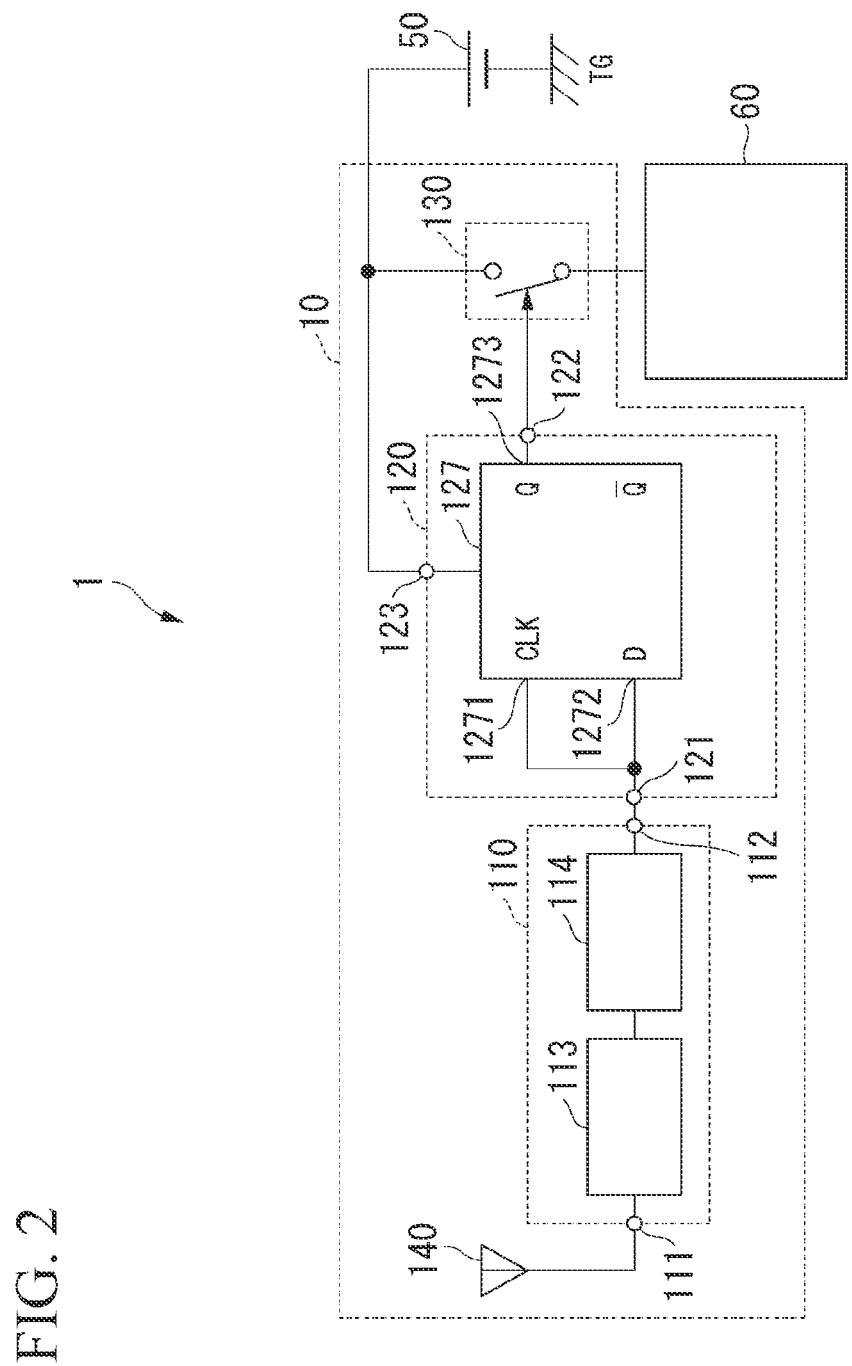
FIG. 2 is a diagram illustrating an example of a constitution of a latch module in a first embodiment.

FIG. 2 is a diagram illustrating an example of a constitution of the latch module 1 in the first embodiment. In FIG. 2, the latch module 1 includes a latch circuit 10, a power supply 50, and a load 60.

The latch circuit 10 includes an antenna 140, a power conversion circuit 110, a control circuit 120, and a switch 130.

The antenna 140 is connected to the power conversion circuit 110. The antenna 140 receives radio waves 71 transmitted from a transmitter 70.

The power conversion circuit 110 includes a power input terminal 111 as an input terminal and a DC power output terminal 112 as an output terminal. Radio waves received by the antenna 140 are input to the power input terminal 111. The electric power obtained by the radio waves received by the antenna 140 is converted into DC electric power and output. The DC power output terminal 112 outputs the DC electric power converted by the power conversion circuit 10. That is to say, the power conversion circuit 110 includes the power input terminal 111 to which the electric power obtained by the radio waves received by the antenna 140 capable of receiving radio waves is input and the DC power output terminal 112 configured to output DC electric power. Furthermore, the power conversion circuit 110 converts the electric power input to the power input terminal 111 into DC electric power and the converted DC electric power is output from the DC power output terminal 112.

The power conversion circuit 110 may include an RF-DC conversion circuit 113 and a booster circuit 114.

The RF-DC conversion circuit 113 converts the electric power obtained by the radio waves input to the power input terminal 111 into DC electric power. The RF-DC conversion circuit 113 outputs the converted DC electric power to the booster circuit 114.

The booster circuit 114 steps up a voltage of the DC electric power converted by the RF-DC conversion circuit 113. The booster circuit 114 outputs the stepped-up electric power via the DC power output terminal 112.

The control circuit 120 includes an input terminal 121 connected to the DC power output terminal 112 of the power conversion circuit 110 and an output terminal 122 connected to the switch 130 and configured to control a connection state of the switch 130. The control circuit 120 includes a power supply terminal 123 as a power source terminal.

The DC electric power output by the power conversion circuit 110 is input to the input terminal 121. The output terminal 122 outputs an output signal corresponding to a state of the input terminal 121. Electric power is supplied from the power supply 50 to a power supply terminal 123.

The switch 130 is connected between the power supply 50 configured to output DC electric power and the load 60 driven through the DC electric power supplied from the power supply 50. The switch 130 switches a connection state between the power supply 50 and the load 60 from a non-conduction state to a conduction state.

The non-conduction state is a state in which the supply of electric power from the power supply 50 to the load 60 is cut off and the conduction state is a state in which electric power is supplied from the power supply 50 to the load 60.

In this example, the control circuit 120 includes a flip-flop 127. The flip-flop 127 switches a control signal output from the output terminal 122.

Although FIG. 2 illustrates an example in which a D flip-flop (a D-F/F) is utilized as the flip-flop 127, the D-F/F may be composed of another flip-flop such as a T flip-flop.

The control circuit 120 controls a conduction state of the switch 130. To be specific, the control circuit 120 controls the connection state of the switch 130 such that it is in a conduction state when the power conversion circuit 110 outputs DC electric power due to the antenna 140 receiving the radio waves 71.

To be more specific, the input terminal 121 of the control circuit 120 is connected to a CLK terminal 1271 and a D terminal 1272 of the flip-flop 127. Furthermore, the output terminal 122 of the control circuit 120 is connected to a Q terminal 1273 of the flip-flop 127.

Since the input terminal 121 has a low level (the same potential as a ground potential) in a state in which the antenna 140 is not receiving the radio waves 71 (that is, in a state in which the transmitter 70 is distant from the latch circuit 10 or the radio waves 71 are not being transmitted from the transmitter 70), the Q terminal 1273 has the low level held therein. In this state, the switch 130 is controlled such that it is brought into a non-conduction state. That is to say, in this state, electric power is not supplied from the power supply 50 to the load 60.

The RF-DC conversion circuit 113 outputs DC electric power to the booster circuit 114 in a state in which the antenna 140 is receiving the radio waves 71 (that is, in a state in which the radio waves 71 are being transmitted from the transmitter 70 or the transmitter 70 is brought closer to the latch circuit 10). The booster circuit 114 performs stepping-up until the Q terminal 1273 of the flip-flop 127 has a changing threshold value potential or more. At this time, in the power conversion circuit 110, a potential sufficient to change a state of the Q terminal 1273 is input to the CLK terminal 1271 and the D terminal 1272 of the flip-flop 127. Thus, the level of the Q terminal 1273 is changed to a high level. In this state, the switch 130 is controlled such that it is brought into a conduction state.

If the switch 130 is controlled such that it is brought into a conduction state, the power supply 50 supplies electric power to the load 60 via the switch 130.

Since electric power is supplied from the power supply 50 to the flip-flop 127, even if the antenna 140 transitions to a state in which the antenna 140 does not receive the radio waves 71 (that is, a state in which the latch circuit 10 does not receive radio waves due to reasons such as the transmitter 70 moving to a position in which the transmitter is distance from the latch circuit 10), the Q terminal 1273 continues to output a high level.

In this embodiment, when the switch 130 is switched such that it is brought into a conduction state, the control circuit 120 keeps the switch 130 conductive using electric power supplied from the power supply 50 to the power supply terminal 123.

In this example, since the flip-flop 127 is connected to the power supply 50 via the power supply terminal 123, a constitution in which the flip-flop 127 with low electric power consumption is selected to significantly minimize an influence on a battery lifespan may be provided. For example, a flip-flop with low electric power consumption of less than 1 µA (microampere) may be selected.

Figure 3:
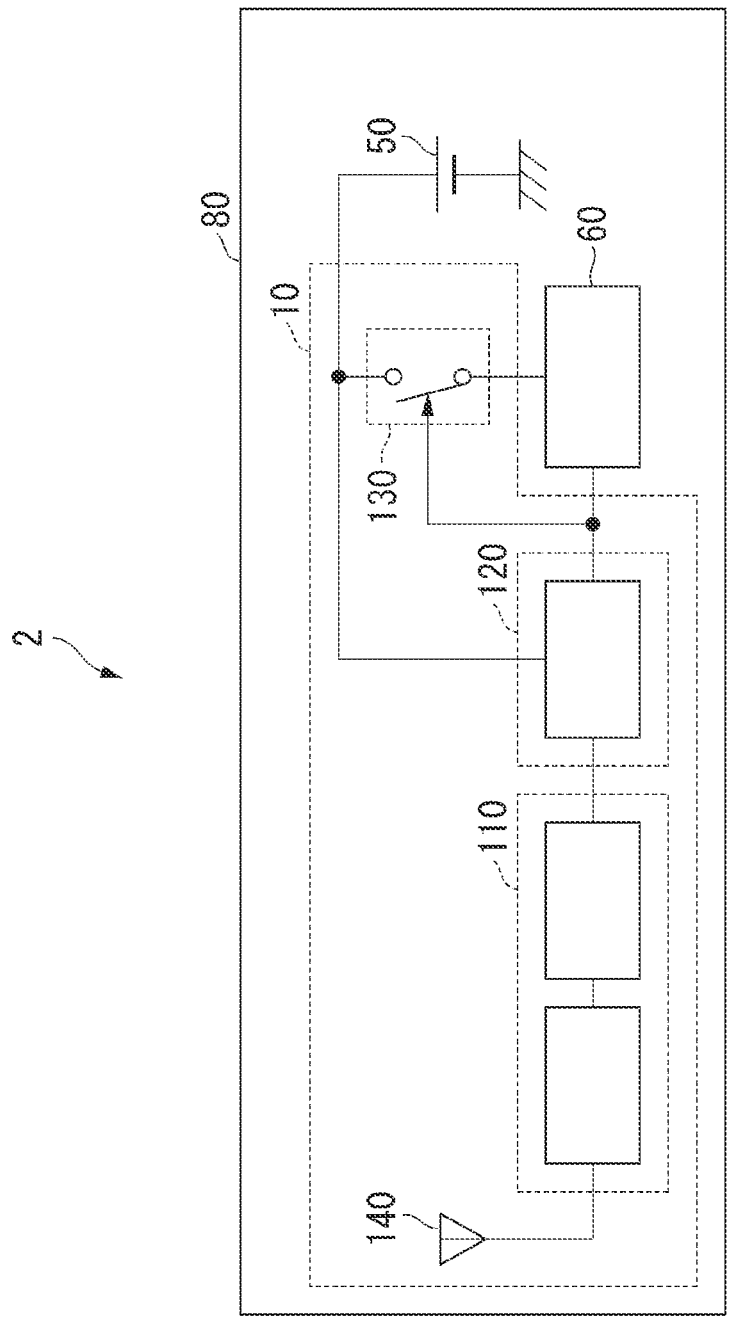
FIG. 3 is a diagram illustrating an example of a housing with a waterproof structure in the first embodiment.

FIG. 3 is a diagram illustrating an example of a housing with a waterproof structure in the first embodiment. As illustrated in FIG. 3, a latch waterproof module 2 includes the latch circuit 10, the power supply 50 configured to output DC electric power, the load 60 configured to be driven by DC electric power supplied from the power supply 50, and a housing 80.

The housing 80 includes the latch circuit 10, the power supply 50, and the load 60 accommodated therein. The housing 80 has waterproofness.

Summary of Effects of First Embodiment

According to the embodiment described above, the latch circuit 10 controls a connection state between the power supply 50 and the load 60 such that it is in a conduction state using the radio waves received by the antenna 140.

In the related art, in the small-sized device as shipped with the battery installed in the board, electric power is supplied the moment the battery is installed, and the consumption of the battery begins. Although it is desirable that electric power be supplied only after the device is delivered to a customer or when a customer intends to supply electric power in view of a battery lifespan, contact switches, (removable) insulating films, and the like lead to an increase in size of the small-sized device.

The latch circuit 10 can minimize an increase in size of the small-sized device by controlling a connection state between the power supply 50 and the load 60 such that it is in a conduction state using the radio waves received by the antenna 140.

Also, according to the above-described embodiment, in the latch circuit 10, the power conversion circuit 110 converts the electric power obtained by the radio waves received by the antenna 140 into DC electric power and the control circuit 120 controls a conduction state of the switch 130. Since the latch circuit 10 can switch a state of the switch 130 such that it is in a conduction state even using weak radio waves when including the control circuit 120, it does not take time to start up the AFE which is a load. Thus, it is possible to provide the latch module 1 in which it does not take time from the reception of radio waves to the starting-up of the load 60.

Therefore, it is possible to provide the convenient latch circuit 10.

Also, according to the above-described embodiment, the control circuit 120 included in the latch circuit 10 receives electric power supplied from the power supply 50. Therefore, after the antenna 140 receives radio waves, the latch circuit 10 can keep the connection state of the switch 130 conductive even in a state in which the antenna 140 does not receive radio waves.

Furthermore, according to the above-described embodiment, the control circuit 120 includes the flip-flop 127. Therefore, the control circuit 120 can switch and keep the connection state of the switch 130 using a simple constitution.

In addition, according to the above-described embodiment, the latch module 1 is accommodated in the housing 80 with waterproofness. For example, when the starting-up of the system is required in a non-contact state in a device used in a sealed state in water, it is possible to start up the system in a non-contact state by applying the latch module 1 in this embodiment.

Examples of the device used in a sealed state in water a water quality measurement device, a small-sized camera device, and the like. Furthermore, the expression "in water" includes not only water but also a wide range of liquids such as electrolytic solutions and body fluids.

Second Embodiment

A second embodiment of the present invention will be described below with reference to the drawings.

Figure 4A:
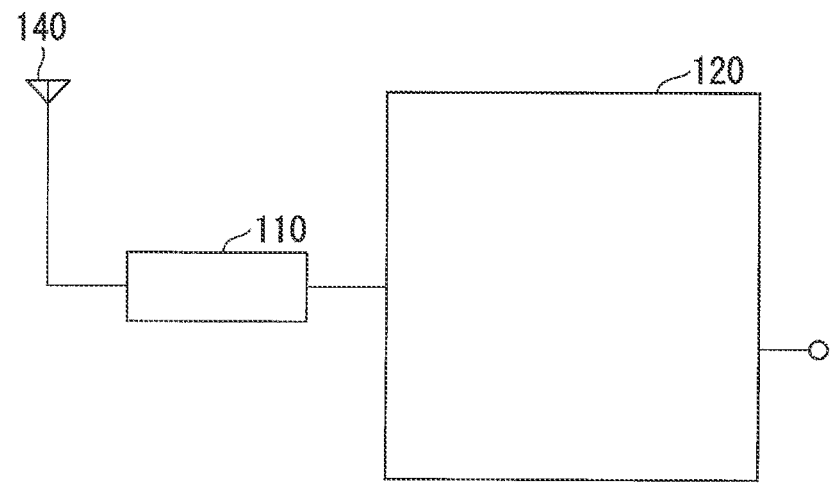
FIGS. 4A and 4B are exemplary diagrams illustrating a first antenna and a second antenna, respectively, in a second embodiment.
Figure 4B:
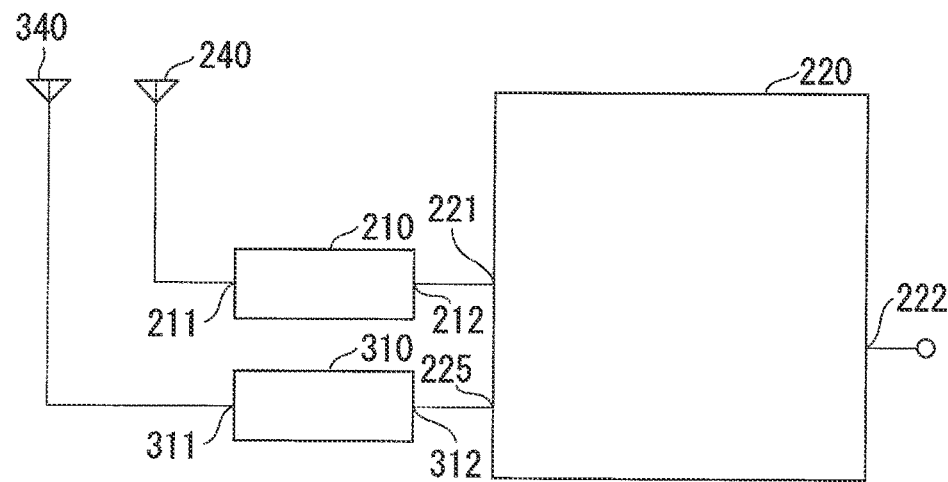

FIG. 4B is a diagram illustrating an example of a first antenna 240 and a second antenna 340 in the second embodiment. FIG. 4A is a diagram illustrating an example of a constitution of a case in which the latch module 1 described above includes one antenna 140. In this case, the radio waves received by the antenna 140 is converted into DC electric power by the power conversion circuit 110 and input to the control circuit 120.

The control circuit 120 controls the switch 130 from a non-conduction state to a conduction state. In the case of this example, the control circuit 120 cannot control the switch 130 from a conduction state to a non-conduction state.

FIG. 4B is a diagram illustrating an example of a constitution in a case in which the latch module 1 includes two antennas (a first antenna 240 and a second antenna 340). In this case, the latch module 1 includes the first antenna 240, a first power conversion circuit 210, the second antenna 340, a second power conversion circuit 310, and a control circuit 220.

In this example, the first antenna 240 and the second antenna 340 may be provided at different angles from each other.

The first antenna 240 is provided to be able to receive first radio waves in a first direction.

The first power conversion circuit 210 includes a first power input terminal 211 and a first DC power output terminal 212. The first power input terminal 211 is connected to the first antenna 240. The first DC power output terminal 212 is connected to the control circuit 220.

The electric power obtained by the first radio waves received by the first antenna 240 is input to the first power input terminal 211. If the electric power is input to the first power input terminal 211, the first power conversion circuit 210 converts the electric power input to the first power input terminal 211 into DC electric power. The first power conversion circuit 210 outputs DC electric power from the first DC power output terminal 212.

The second antenna 340 is provided to be able to receive second radio waves in a second direction different from the first direction.

The second power conversion circuit 310 includes a second power input terminal 311 and a second DC power output terminal 312. The second power input terminal 311 is connected to the second antenna 340. The second DC power output terminal 312 is connected to the control circuit 220.

The electric power obtained by the second radio waves received by the second antenna 340 is input to the second power input terminal 311. If the electric power is input to the second power input terminal 311, the second power conversion circuit 310 converts the electric power input to the second power input terminal 311 into DC electric power. The second power conversion circuit 310 outputs DC electric power from the second DC power output terminal 312.

The control circuit 220 includes, as input/output terminals, a first input terminal 221, a second input terminal 225, and an output terminal 222.

The first input terminal 221 is connected to the first DC power output terminal 212 of the first power conversion circuit 210. The second input terminal 225 is connected to the second DC power output terminal 312 of the second power conversion circuit 310. The output terminal 222 is connected to the switch 130 and controls the connection state of the switch 130.

The control circuit 220 controls the connection state of the switch 130 such that it is in a conduction state when the first power conversion circuit 210 outputs DC electric power due to the reception of the first radio waves by the first antenna 240. The control circuit 220 controls the connection state of the switch 130 such that it is in a non-conduction state when the second power conversion circuit 310 outputs DC electric power due to the reception of the second radio waves by the second antenna 340.

In this way, in the example illustrated in FIG. 4B, the control circuit 220 can not only control the switch 130 from a non-conduction state to a conduction state, but also control the switch 130 from a conduction state to a non-conduction state.

Figure 5A:
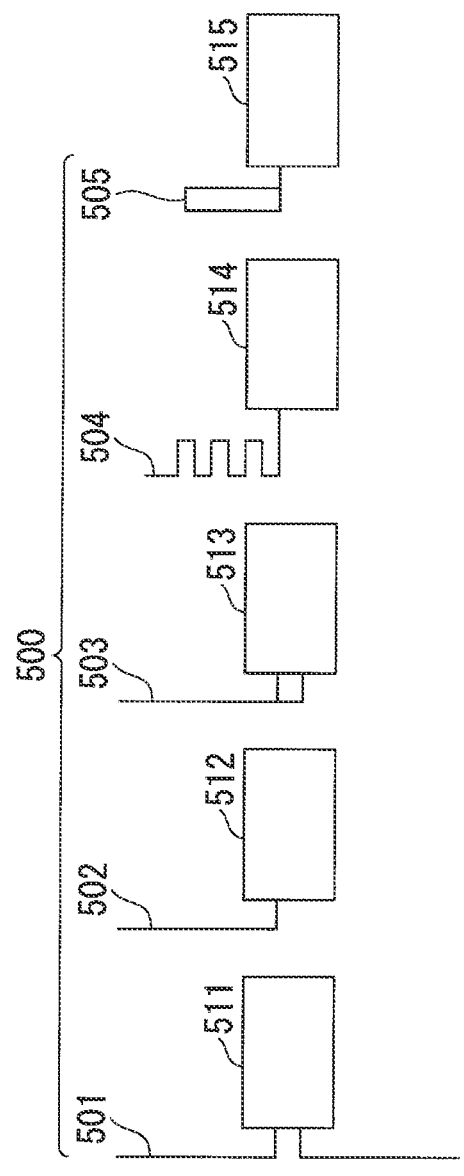
FIGS. 5A and 5B are exemplary diagrams illustrating the first antenna and the second antenna, respectively, in the second embodiment.
Figure 5B:
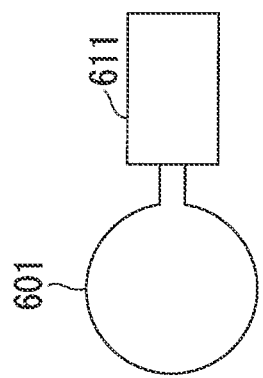

FIGS. 5A and 5B are exemplary diagrams illustrating the first antenna 240 and the second antenna 340, respectively, in the second embodiment.

FIG. 5A is a diagram illustrating an example of an electric field antenna 500 in the second embodiment. FIG. 5A illustrates an example of a type of antenna when the first antenna 240 or the second antenna 340 is the electric field antenna 500.

When the first antenna 240 or the second antenna 340 is the electric field antenna 500, the first antenna 240 or the second antenna 340 may be a dipole antenna 501, a monopole antenna 502, an inverted F antenna 503, a meander line antenna 504, or a chip antenna 505.

FIG. 5B is a diagram illustrating an example of a magnetic field antenna 600 in the second embodiment. FIG. 5B illustrates an example of a type of antenna when the first antenna 240 or the second antenna 340 is the magnetic field antenna 600.

When the first antenna 240 or the second antenna 340 is the magnetic field antenna 600, the first antenna 240 or the second antenna 340 may be a loop antenna 601.

The types of antennas of the first antenna 240 and the second antenna 340 in this embodiment are not limited to the types of antennas illustrated in FIGS. 5A and 5B. In addition, various antennas can be selected as the first antenna 240 and the second antenna 340.

Figure 6:
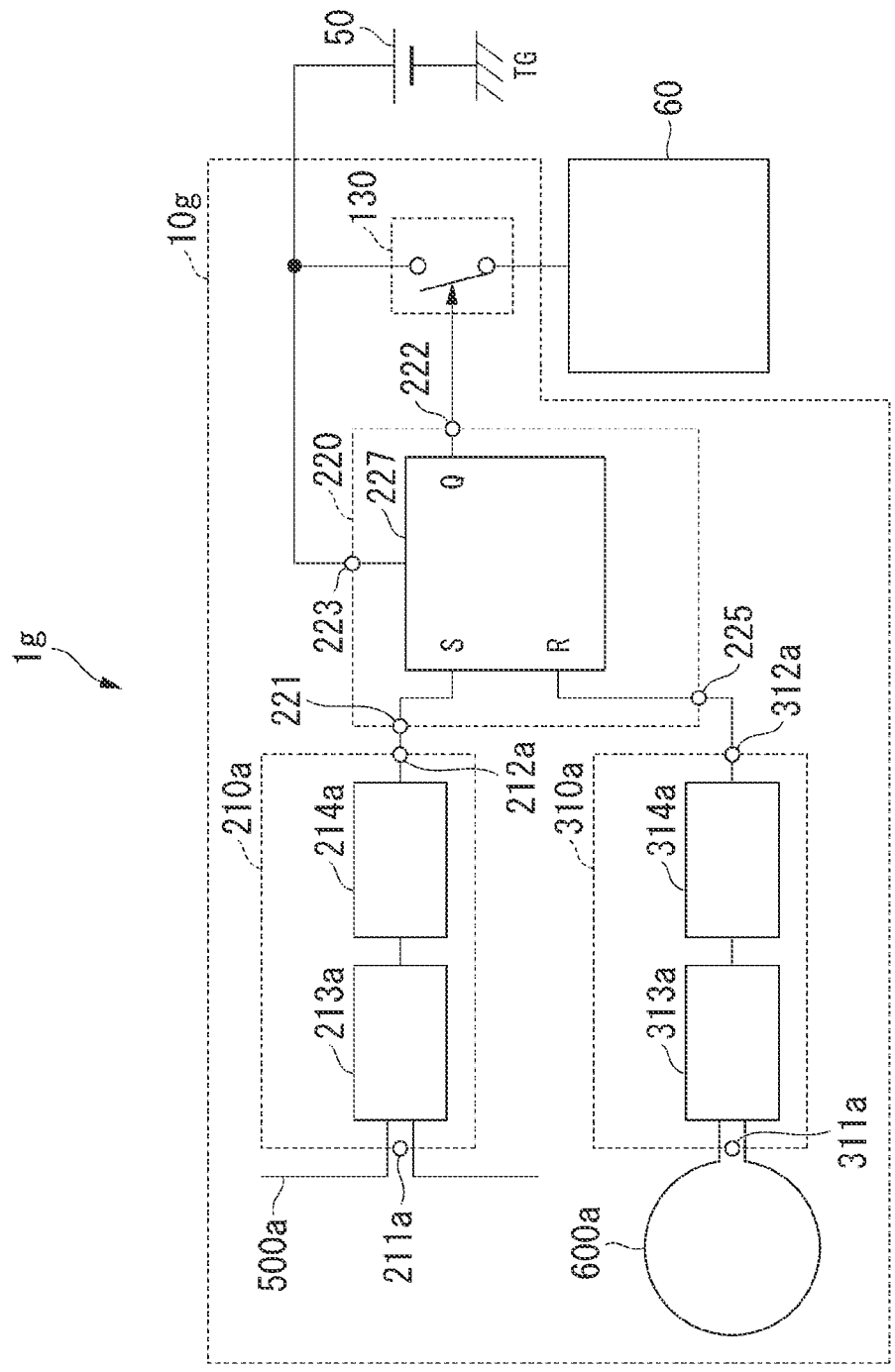
FIG. 6 is a diagram illustrating an example of a constitution of a latch module in the second embodiment.

FIG. 6 is a diagram illustrating an example of a constitution of a latch module 1g in the second embodiment. The latch module 1g illustrated in FIG. 6 is a modified example of the latch module 1 in the first embodiment. A constituent element in this modified example that is the same as the latch module 1 described above will be denoted by the same reference numeral and a description thereof will be omitted.

In FIG. 6, the latch module 1g includes a latch circuit 10g, a power supply 50, and a load 60.

The latch circuit 10g includes an electric field antenna 500a, a magnetic field antenna 600a, a first power conversion circuit 210a, a second power conversion circuit 310a, a control circuit 220, and a switch 130. The electric field antenna 500a is an example of a first antenna 240 and the magnetic field antenna 600a is an example of a second antenna 340.

The first power conversion circuit 210a may include an RF-DC conversion circuit 213a and a booster circuit 214a and the second power conversion circuit 310a may include an RF-DC conversion circuit 313a and a booster circuit 314a.

The electric field antenna 500a receives first radio waves in a first direction. Electric power when the electric field antenna 500a receives the first radio waves is input to the first power input terminal 211a of the first power conversion circuit 210a. The first power conversion circuit 210a converts the input electric power into DC electric power and outputs the converted DC electric power to the first DC power output terminal 212a.

In this case, since the magnetic field antenna 600a is installed to be able to receive second radio waves in a second direction different from the first direction, the magnetic field antenna 600a does not receive the first radio waves. Therefore, DC electric power is input to only the first input terminal 221 of the control circuit 220.

The magnetic field antenna 600a receives the second radio waves in the second direction. Electric power when the magnetic field antenna 600a receives the second radio waves is input to the second power input terminal 311a of the second power conversion circuit 310a. The second power conversion circuit 310a converts the input electric power into DC electric power and outputs the converted DC electric power to the second DC power output terminal 312a.

In this case, since the electric field antenna 500a is installed to be able to receive the first radio waves in the first direction different from the second direction, the electric field antenna 500a does not receive the second radio waves. Therefore, DC electric power is input to only the second input terminal 225 of the control circuit 220.

In this example, the control circuit 220 includes a flip-flop 227. The flip-flop 227 switches a control signal outputs from the output terminal 222 on the basis of a potential of the first input terminal 221 and a potential of the second input terminal 225.

To be specific, the flip-flop 227 is an SR flip-flop (SR-F/F). To be more specific, the first input terminal 221 is connected to an S terminal of the flip-flop 227, the second input terminal 225 is connected to an R terminal of the flip-flop 227, and the output terminal 222 is connected to a Q terminal.

In a state in which the electric field antenna 500a receives the first radio waves, the first power conversion circuit 210a outputs DC electric power. The output DC electric power is input to the S terminal in which a potential according to the DC electric power corresponds to that of the first input terminal 221 of the flip-flop 227. When the input potential exceeds a threshold value voltage in which a state of the flip-flop 227 is caused to be changed, that is, if a high level is input to the S terminal of the flip-flop 227, the Q terminal of the flip-flop 227 outputs a high level. In this state, the switch 130 is controlled such that it is brought into a conduction state. If the switch 130 is controlled such that it is brought into the conduction state, the power supply 50 supplies electric power to the load 60.

In a state in which the magnetic field antenna 600a receives the second radio waves, the second power conversion circuit 310a outputs DC electric power. The output DC electric power is input to the R terminal in which a potential according to the DC electric power corresponds to that of the second input terminal 225 of the flip-flop 227. When the input potential exceeds a threshold value voltage in which a state of the flip-flop 227 is caused to be changed, that is, if a high level is input to the R terminal of the flip-flop 227, the Q terminal of the flip-flop 227 outputs a low level. In this state, the switch 130 is controlled to be in a non-conduction state.

Electric power is supplied from the power supply 50 to the control circuit 220 including the flip-flop 227. Therefore, in a state in which both of the electric field antenna 500a and the magnetic field antenna 600a do not receive radio waves, the flip-flop 227 continues to keep an output state of the Q terminal. That is to say, a connection state of the switch 130 differs depending on whether it is controlled such that it is in a conduction state or in a non-conduction state in accordance with whether the electric field antenna 500a or the magnetic field antenna 600a finally receives radio waves. If the switch 130 is controlled such that it is brought into the non-conduction state, the power supply 50 stops the supply of electric power to the load 60.

In this example, since the flip-flop 227 is connected to the power supply 50 via a power supply terminal 223, a constitution in which the flip-flop 227 with low electric power consumption is selected to significantly minimize an influence on a battery lifespan may be provided. For example, a flip-flop with low electric power consumption of less than 1 μA (microampere) may be selected.

Also, the control circuit 220 may be composed of a low power consumption latch circuit having a function equivalent to that of a flip-flop.

Figure 7:
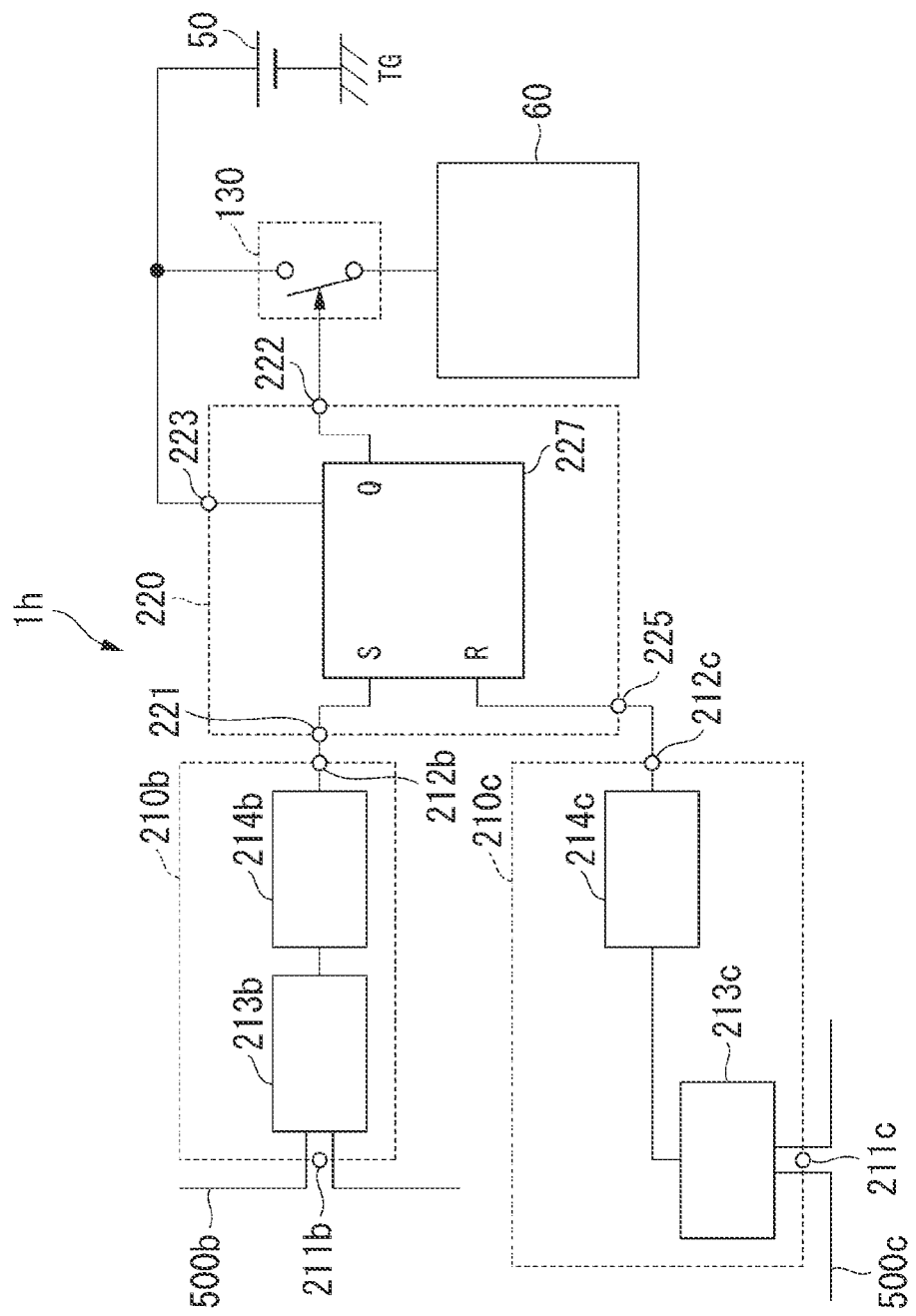
FIG. 7 is a diagram illustrating a first modified example of the constitution of the latch module in the second embodiment.

FIG. 7 is a diagram illustrating a first modified example of the constitution of the latch module 1 in the second embodiment. A latch module 1h illustrated in FIG. 7 is a modified example of the latch module 1g described above. A constituent element in this modified example that is the same as the latch module 1g will be denoted by the same reference symbol and a description thereof will be omitted. The latch module 1h has a constitution different from that of the latch module 1g in that both of the first antenna 240 and the second antenna 340 utilize the electric field antenna 500.

In the example illustrated in FIG. 7, the electric field antenna 500b (the first antenna 240) and the electric field antenna 500c (the second antenna 340) are provided at different positions from each other. That is to say, in the latch module 1h, installation positions of the antennas are different from each other. Each of the installation positions is a position in the latch module 1h in which the antenna is installed.

The electric field antenna 500b is installed to be able to receive first radio waves in a first direction. The electric field antenna 500c is installed to be able to receive second radio waves in a second direction different from the first direction.

Figure 8:
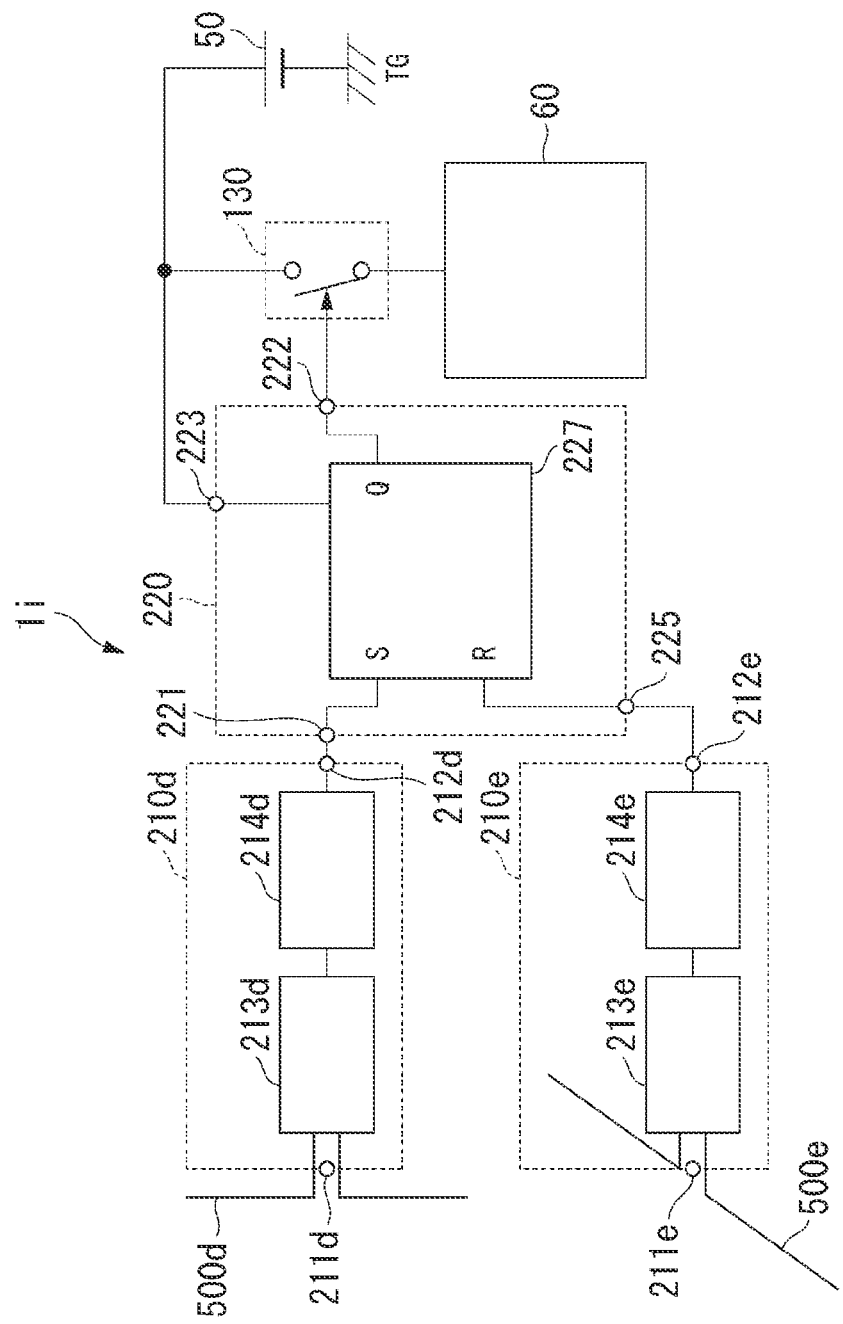
FIG. 8 is a diagram illustrating a second modified example of the constitution of the latch module in the second embodiment.

FIG. 8 is a diagram illustrating a second modified example of the constitution of the latch module 1 in the second embodiment. A latch module 1i illustrated in FIG. 8 is a modified example of the latch module 1h described above. A constituent element in this modified example that is the same as the latch module 1h will be denoted by the same reference symbol and a description thereof will be omitted. The latch module 1i has a constitution different from that of the latch module 1h in that installation angles of the first antenna 240 and the second antenna 340 are different from each other.

In this example illustrated in FIG. 8, the latch module 1i includes an electric field antenna 500d and an electric field antenna 500e. The electric field antenna 500d is an example of the first antenna 240 and the electric field antenna 500e is an example of the second antenna 340.

In the example illustrated in FIG. 8, the electric field antenna 500b (the first antenna 240) and the electric field antenna 500c (the second antenna 340) are provided at different angles. That is to say, since the first radio waves and the second radio waves are provided at different angles, the first radio waves and the second radio waves do not interfere with each other.

As an example, the electric field antenna 500b (the first antenna 240) and the electric field antenna 500c (the second antenna 340) may be provided perpendicular to each other.

Figure 9A:
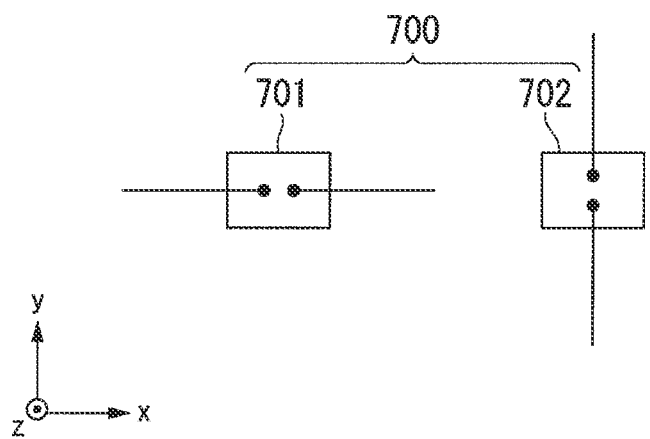
FIGS. 9A and 9B are diagrams illustrating a third modified example of the constitution of the latch module in the second embodiment.
Figure 9B:
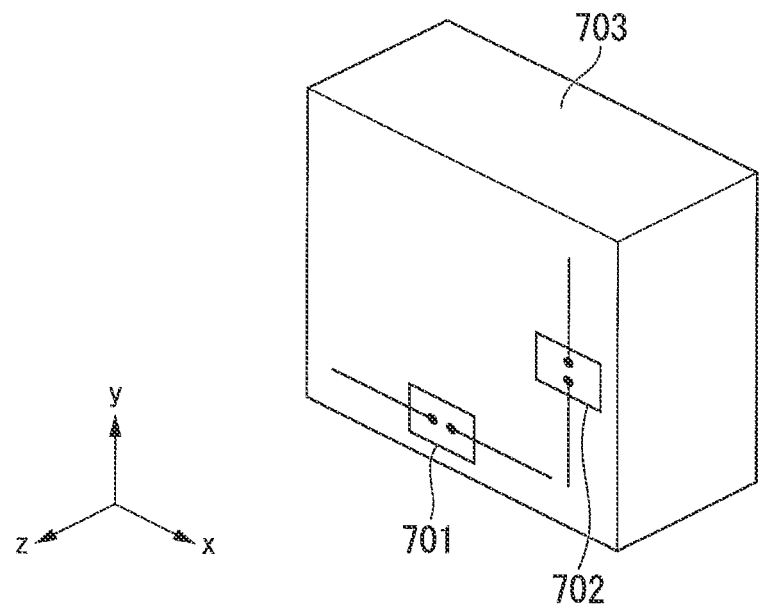

FIGS. 9A and 9B are diagrams illustrating a third modified example of the constitution of the latch module 1 in the second embodiment.

FIG. 9A is a diagram illustrating the arrangement of an antenna 701 and an antenna 702 using a two-dimensional Cartesian coordinate system of an x axis and a y axis. The antenna 701 illustrated in FIGS. 9A and 9B is an example of the first antenna 240 described above and the antenna 702 is an example of the second antenna 340 described above. Hereinafter, when the antenna 701 and the antenna 702 are not distinguished, the antenna 701 and the antenna 702 are referred to as an "antenna 700." The antenna 700 is an example of the electric field antenna 500.

The antenna 701 is arranged along the x axis. The antenna 702 is arranged along the y axis. In this example, the antenna 701 and the antenna 702 are arranged at different angles from each other.

FIG. 9B is a diagram illustrating the arrangement of the antenna 701 and the antenna 702 using a three-dimensional Cartesian coordinate system of an x axis, a y axis, and a z axis. In FIG. 9B, the arrangement of the antenna 701 and the antenna 702 illustrated using the two-dimensional Cartesian coordinate system of the x axis and the y axis in FIG. 9A is illustrated in a three-dimensional space.

The antenna 701 and the antenna 702 are accommodated in a housing 703. Furthermore, the antenna 701 and the antenna 702 are arranged in the same plane. When the antenna 701 and the antenna 702 are arranged at different angles from each other as illustrated in FIG. 9B, even when the antenna 701 and the antenna 702 are arranged on the same plane, the first radio waves and the second radio waves do not interfere with each other.

Figure 10:
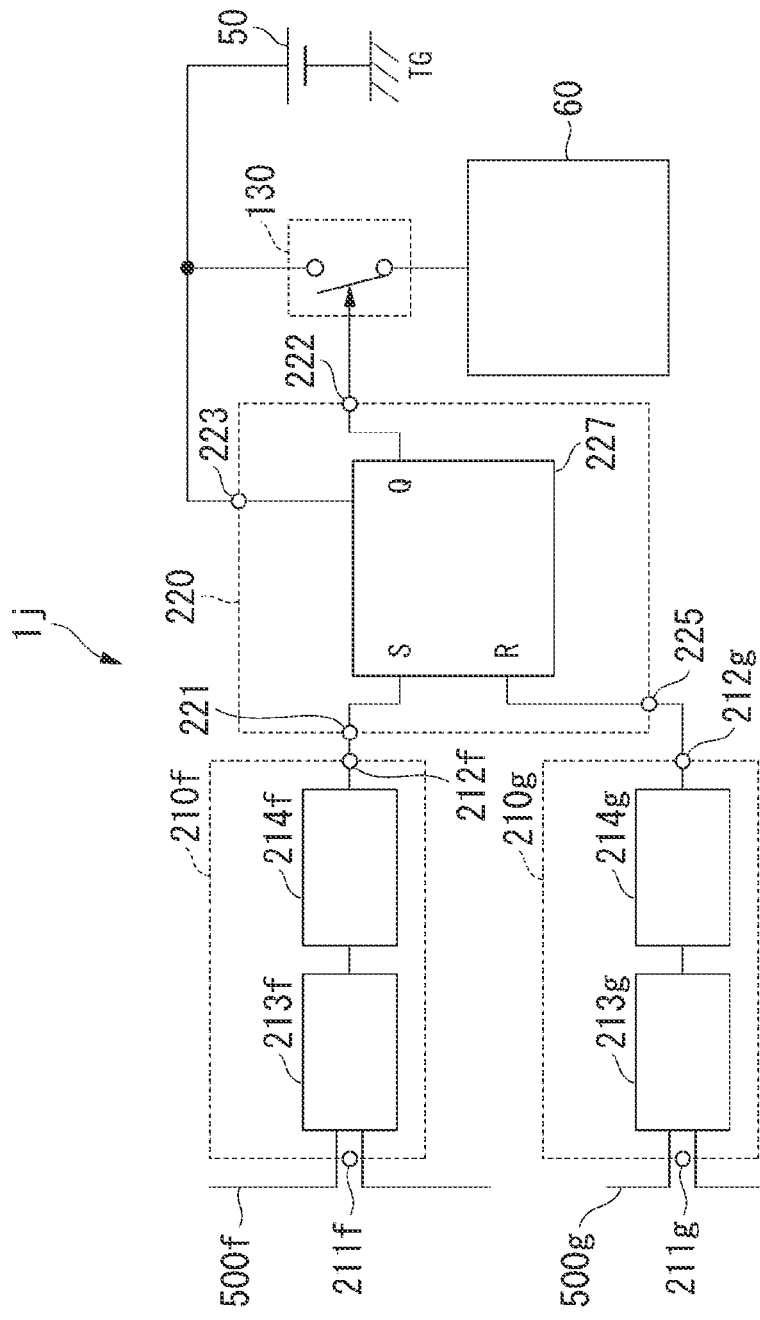
FIG. 10 is a diagram illustrating a fourth modified example of the constitution of the latch module in the second embodiment.

FIG. 10 is a diagram illustrating a fourth modified example of the constitution of the latch module 1 in the second embodiment. A latch module 1j illustrated in FIG. 10 is a modified example of the latch module 1i described above. A constituent element in this modified example that is the same as the latch module 1i will be denoted by the same reference symbols and a description thereof will be omitted. The latch module 1j has a constitution different from that of the latch module 1i in that, although the installation angles of the first antenna 240 and the second antenna 340 are the same, the first antenna 240 and the second antenna 340 include the dipole antennas 501 having different lengths from each other.

In the example illustrated in FIG. 10, the latch module 1j includes an electric field antenna 500f and an electric field antenna 500g. The electric field antenna 500f is an example of the first antenna 240 and the electric field antenna 500g is an example of the second antenna 340.

In this example, the electric field antenna 500f and the electric field antenna 500g includes antennas having lengths different from each other. In order to minimize the interference between the first radio waves and the second radio waves, the length of the electric field antenna 500f and the length of the electric field antenna 500g are selected on the basis of frequency of the radio waves. For example, the length of the electric field antenna 500f and the length of the electric field antenna 500g are preferably ½ or ¼ of wavelengths λ of the radio waves received by the antennas. In this case, the electric field antenna 500f and the electric field antenna 500g can efficiently receive radio waves without generating reflected waves.

To be specific, when the frequency of the first radio waves is 2.4 GHz and the frequency of the second radio waves is 5 GHz, a wavelength of the first radio waves is about 12.5 cm and a wavelength of the second radio waves is about 6 cm. Furthermore, when a dipole antenna with a wavelength of λ/2 is utilized, in each antenna, a length of the antenna configured to receive the first radio waves is 6.25 cm and a length of the antenna configured to receive the second radio waves is 3 cm.

As described above, when a constitution in which a latch module 1k in which the dipole antenna 501 having an antenna length of ½ of the wavelengths λ of the first radio waves and the second radio waves of different wavelengths is utilized is provided, it is possible to minimize interference between the first radio waves and the second radio waves. In this case, one of the radio waves can be used for turning on the switch 130 and the other of the radio waves can be used for turned off the switch 130.

Although a case in which a length of the first antenna 240 and a length of the second antenna 340 are different has been described using an example of the dipole antenna 501, the same applies not only to an example of the dipole antenna 501, but also to the monopole antenna 502, the inverted F antenna 503, the meander line antenna 504, and the chip antenna 505. Similarly, these antennas may be configured so that a length of the antenna included in the first antenna 240 and a length of the antenna included in the second antenna 340 are different.

Figure 11:
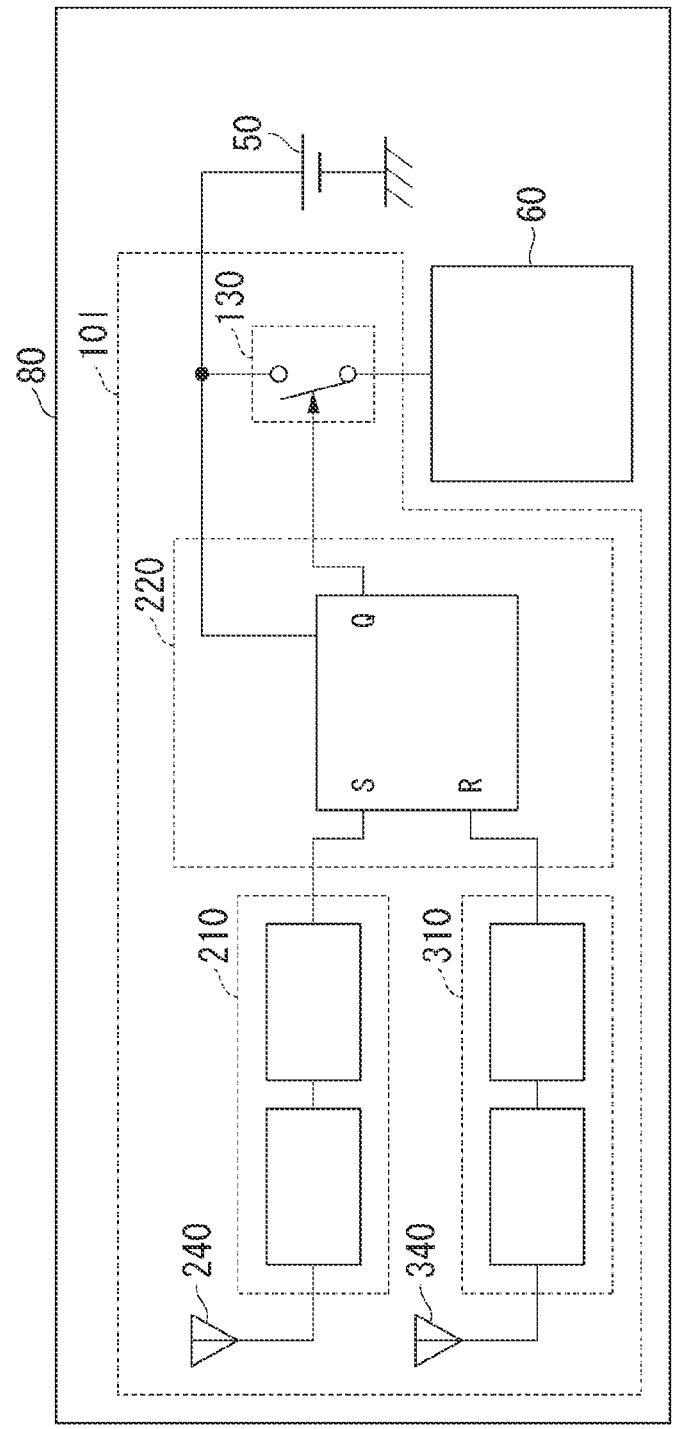
FIG. 11 is a diagram illustrating an example of a housing with a waterproof structure in the second embodiment

FIG. 11 is a diagram illustrating an example of a housing having a waterproof structure in the second embodiment. As illustrated in FIG. 11, a latch waterproof module 2b includes a latch circuit 101, a power supply 50 configured to output DC electric power, a load 60 driven by DC electric power supplied from the power supply 50, and a housing 80.

The housing 80 includes the latch circuit 101, the power supply 50, and the load 60 accommodated therein. The housing 80 is waterproof.

Summary of Effects of Second Embodiment

According to the embodiment described above, the latch module 1 switches a connection state of the switch 130 by detecting the first radio waves received by the first antenna 240 and the second radio waves received by the second antenna 340. The latch module 1 can switch the switch 130 from a non-conduction state to a conduction state when configured in this way. Furthermore, the latch module 1 can switch the switch 130 from a conduction state to a non-conduction state.

Also, according to the above-described embodiment, the first antenna 240 and the second antenna 340 are provided at different positions from each other. Therefore, the latch module 1 can prevent the first radio waves in the first direction and the second radio waves in the direction different from the first direction from interfering with each other. That is to say, it is possible to prevent a malfunction.

Furthermore, according to the above-described embodiment, the first antenna 240 and the second antenna 340 are provided at different angles from each other. Therefore, the latch module 1 can prevent the first radio waves in the first direction and the second radio waves in the direction different from the first direction from interfering with each other. That is to say, it is possible to prevent a malfunction.

In addition, according to the above-described embodiment, the first antenna 240 and the second antenna 340 are provided perpendicular to each other. Therefore, according to the above-described embodiment, it is possible to prevent the first radio waves and the second radio waves from interfering with each other. That is to say, it is possible to prevent a malfunction.

Moreover, according to the above-described embodiment, the first antenna 240 is the electric field antenna 500 and the second antenna 340 is the magnetic field antenna 600. Therefore, it is possible to prevent the first radio waves and the second radio waves from interfering with each other. That is to say, it is possible to prevent a malfunction.

While the embodiments of the present invention have been described in detail above with reference to the drawings, the specific constitution is not limited to the embodiments and designs and the like within a range that does not depart from the gist of the present invention are also included. Furthermore, while the operation has been described from an electric current according to the electric power using the radio waves received by the antennas in the embodiments of the present invention, the operation may be described from a voltage according to the electric power using the radio waves received by the antennas.

What is claimed is:

1. An electronic circuit, comprising:
    a switch which is connected between a power supply configured to output direct current (DC) electric power and a load driven by DC electric power supplied from the power supply and which switches a connection state between the power supply and the load to either a conduction state in which a supply of electric power from the power supply to the load is allowed or a non-conduction state in which the supply of electric power from the power supply to the load is cut off;
    a first power conversion circuit which includes a first power input terminal to which electric power obtained by first radio waves received by a first antenna capable of receiving the first radio waves in a first direction is input and a first DC power output terminal configured to output DC electric power and which converts electric power input to the first power input terminal into DC electric power and outputs the converted DC electric power from the first DC power output terminal;
    a second power conversion circuit which includes a second power input terminal to which electric power obtained by second radio waves received by a second antenna capable of receiving the second radio waves in a second direction different from the first direction is input and a second DC power output terminal configured to output DC electric power and which converts electric power input to the second power input terminal into DC electric power and outputs the converted DC electric power from the second DC power output terminal; and
    a control circuit which includes a first input terminal connected to the first DC power output terminal of the first power conversion circuit, a second input terminal connected to the second DC power output terminal of the second power conversion circuit, and an output terminal connected to the switch and configured to control the connection state of the switch and which controls the connection state of the switch such that it is the conduction state when the first power conversion circuit outputs DC electric power due to the reception of the first radio waves by the first antenna and controls the connection state of the switch such that it is the non-conduction state when the second power conversion circuit outputs DC electric power due to the reception of the second radio waves by the second antenna.

2. The electronic circuit according to claim 1, wherein the first antenna and the second antenna are provided at different positions from each other.

3. A module, comprising:
    the electronic circuit according to claim 2;
    a power supply configured to output DC electric power; and
    a load driven by DC electric power supplied from the power supply.

4. The module according to claim 3, wherein the module is accommodated in a waterproof housing.

5. The electronic circuit according to claim 1, wherein the first antenna and the second antenna are provided at different angles from each other.

6. A module, comprising:
    the electronic circuit according to claim 5;
    a power supply configured to output DC electric power; and
    a load driven by DC electric power supplied from the power supply.

7. The module according to claim 6, wherein the module is accommodated in a waterproof housing.

8. The electronic circuit according to claim 1, wherein the first antenna and the second antenna are provided perpendicular to each other.

9. A module, comprising:
    the electronic circuit according to claim 8;
    a power supply configured to output DC electric power; and
    a load driven by DC electric power supplied from the power supply.

10. The module according to claim 9, wherein the module is accommodated in a waterproof housing.

11. The electronic circuit according to claim 1, wherein the first antenna is an electric field antenna, and the second antenna is a magnetic field antenna.

12. A module, comprising:
    the electronic circuit according to claim 11;
    a power supply configured to output DC electric power; and
    a load driven by DC electric power supplied from the power supply.

13. The module according to claim 12, wherein the module is accommodated in a waterproof housing.

14. The electronic circuit according to claim 1, wherein the first antenna and the second antenna are antennas having different lengths from each other.

15. A module, comprising:
    the electronic circuit according to claim 14;
    a power supply configured to output DC electric power; and
    a load driven by DC electric power supplied from the power supply.

16. The module according to claim 15, wherein the module is accommodated in a waterproof housing.

17. A module, comprising:
    the electronic circuit according to claim 1;
    a power supply configured to output DC electric power; and
    a load driven by DC electric power supplied from the power supply.

18. The module according to claim 17, wherein the module is accommodated in a waterproof housing.

19. A system, comprising:
the module according to claim 18; and
a transmitter configured to transmit prescribed radio waves to the module.

20. A system, comprising:
the module according to claim 17; and
a transmitter configured to transmit prescribed radio waves to the module.

\* \* \* \* \*